United States Patent
Park et al.

(10) Patent No.: US 9,123,668 B2
(45) Date of Patent: Sep. 1, 2015

(54) ORGANIC LIGHT-EMITTING DIODE DISPLAYS WITH WHITE SUBPIXELS

(71) Applicant: Apple Inc., Cupertino, CA (US)

(72) Inventors: Young Bae Park, San Jose, CA (US); Shih Chang Chang, Cupertino, CA (US); Vasudha Gupta, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/312,416

(22) Filed: Jun. 23, 2014

(65) Prior Publication Data
US 2015/0090970 A1    Apr. 2, 2015

Related U.S. Application Data

(60) Provisional application No. 61/885,983, filed on Oct. 2, 2013.

(51) Int. Cl.
*H01L 27/32* (2006.01)
(52) U.S. Cl.
CPC .......... *H01L 27/3213* (2013.01); *H01L 27/322* (2013.01)
(58) Field of Classification Search
CPC .................................. H01L 27/3213
USPC ..................... 257/40; 345/204, 690
See application file for complete search history.

(56) References Cited

U.S. PATENT DOCUMENTS

| | | | |
|---|---|---|---|
| 7,397,485 B2 | 7/2008 | Miller et al. | |
| 8,466,856 B2 | 6/2013 | Hamer et al. | |
| 8,502,445 B2 | 8/2013 | Levermore et al. | |
| 2007/0077349 A1 | 4/2007 | Newman et al. | |
| 2008/0049048 A1* | 2/2008 | Credelle et al. | 345/690 |
| 2010/0053043 A1 | 3/2010 | Sakamoto | |
| 2010/0141612 A1* | 6/2010 | Desieres et al. | 345/204 |

\* cited by examiner

*Primary Examiner* — Edward Wojciechowicz
(74) *Attorney, Agent, or Firm* — Treyz Law Group; G. Victor Treyz; Joseph F. Guihan

(57) ABSTRACT

An electronic device may include a display having an array of organic light-emitting diode display pixels that produce light that forms an image. Color filter elements may be used to allow the display to present color images. Each display pixel may have a red subpixel, a blue subpixel, a green subpixel, and a white subpixel. To adjust the color coordinates of the white pixel and thereby ensure that the light from the white pixel has a desired white point, part of the white subpixel may be overlapped by an area of colored color filter material. The white subpixel may, for example have a rectangular white area within which a patch of blue color filter material may be provided to make the white light from the white subpixel more bluish than it would be without the patch of blue color filter material.

20 Claims, 5 Drawing Sheets

ORGANIC LIGHT-EMITTING DIODE DISPLAYS WITH WHITE SUBPIXELS

This application claims the benefit of provisional patent application No. 61/885,983, filed Oct. 2, 2013, which is hereby incorporated by reference herein in its entirety.

BACKGROUND

This relates generally to electronic devices and, more particularly, to electronic devices with organic light-emitting diode displays.

Electronic devices often include displays. For example, an electronic device may have an organic light-emitting diode display with rows and columns of display pixels. The display pixels may each have subpixels with respective red, blue, and green color filter elements. There can be non-negligible amounts of optical absorption in the color filter material of red, blue, and green subpixels, so some designs incorporate white subpixels. Pixel rendering operations may covert red-green-blue data to red-green-blue-white data to ensure that the white subpixels are frequently used. This helps reduce power consumption, because the white subpixels are more efficient at emitting light than the colored subpixels. However, the white light emitted from a white organic light-emitting diode subpixel may have white point color coordinates that do not match target white point color coordinates, leading to images that are colored differently than desired.

It would therefore be desirable to be able to provide improved displays such as improved organic light-emitting diode displays.

SUMMARY

An electronic device may be provided with a display. The display may have an array of display pixels. The display pixels may be organic light-emitting diode display pixels. Control circuitry may be used to direct the display pixels to produce light that forms an image on the display. The display may be a top-emission organic light-emitting diode display or may be a bottom-emission organic light-emitting display.

Thin-film transistor circuitry on the display may be used to apply currents to organic electroluminescent material to create the light for the image. Color filter elements may be used to allow the display to present color images.

Each display pixel may have a red subpixel, a blue subpixel, a green subpixel, and a white subpixel. The red subpixels may be formed using red color filter elements. The blue subpixels may be formed using blue color filter elements. The green subpixels may be formed using green color filter elements. White subpixels may be substantially free of color filter material so that white light from white organic light-emitting diode structures may be emitted from the display.

To adjust the color coordinates of the white subpixel and thereby ensure that the white light from the white pixel has a desired white point, the white subpixel may be provided with an area of colored color filter material. The area of the colored color filter material may cover a fraction of the total area of the white subpixel. For example, the area of the colored color filter material may be one fifth or less or one tenth or less of the total area of the white subpixel (as examples).

The colored color filter element may be formed from a patch of blue color filter material having a relatively small area relative to the total area of the white subpixel. Because the size of the patch of blue material in the white subpixel is relatively small, the blue patch merely adjusts the white point of the white subpixel and does not substantially alter the white nature of the light being emitted by the white subpixel. The presence of the blue patch also does not significantly degrade white light emission efficiency. When the blue patch is included in the white subpixels, it is no longer necessary to turn on the blue subpixel to make the white light from the white subpixels more bluish in color. Accordingly, the lifetime of the blue subpixels is not undesirably decreased.

The white subpixel may, for example, have a rectangular area within which a patch of blue color filter material may be provided to make the white light from the white subpixel more bluish than it would be without the patch of blue color filter material.

DETAILED DESCRIPTION

Figure 1:
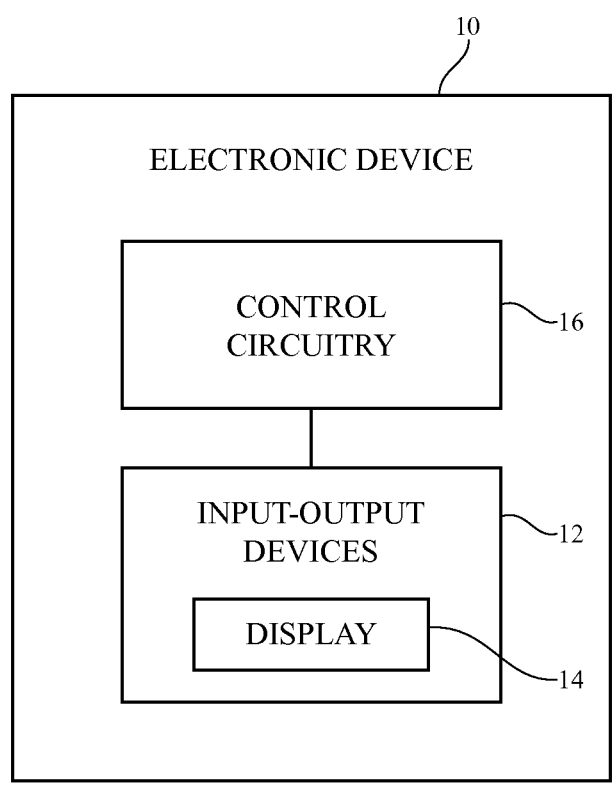
FIG. 1 is a diagram of an illustrative electronic device having a display in accordance with an embodiment.

An illustrative electronic device of the type that may be provided with an organic light-emitting diode display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio codec chips, application specific integrated circuits, etc.

Input-output circuitry in device 10 such as input-output devices 12 may be used to allow data to be supplied to device 10 and to allow data to be provided from device 10 to external devices. Input-output devices 64 may include buttons, joysticks, click wheels, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 in input-output devices.

Figure 2:
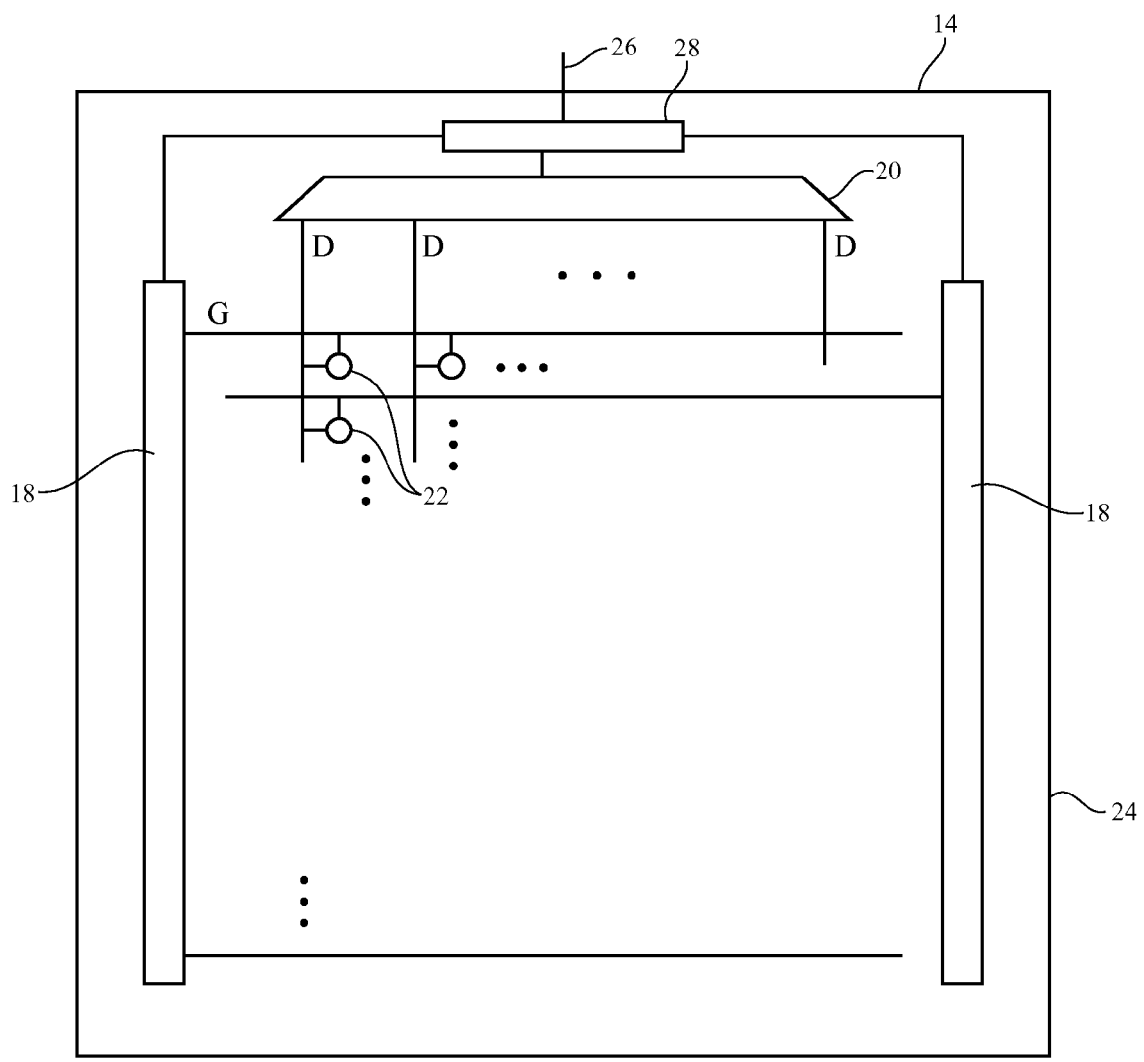
FIG. 2 is a diagram of an illustrative organic light-emitting diode display in accordance with an embodiment.

Display 14 may be an organic light-emitting diode display. As shown in the illustrative diagram of FIG. 2, display 14 may include layers such as substrate layer 24. Layers such as substrate 24 may be formed from planar rectangular layers of material such as planar glass layers and planar polymer layers.

Display 14 may have an array of display pixels 22 for displaying images for a user. The array of display pixels 22 may be formed from rows and columns of display pixel structures (e.g., display pixels formed from structures on display layers such as substrate 24). There may be any suitable number of rows and columns in the array of display pixels 22 (e.g., ten or more, one hundred or more, or one thousand or more).

Display driver circuitry such as display driver integrated circuit 28 may be coupled to conductive paths such as metal traces on substrate 24 using solder or conductive adhesive. Display driver integrated circuit 28 (sometimes referred to as a timing controller chip) may contain communications circuitry for communicating with system control circuitry over path 26. Path 26 may be formed from traces on a flexible printed circuit or other cable. The control circuitry may be located on a main logic board in an electronic device in which display 14 is being used. During operation, the control circuitry on the logic board (e.g., control circuitry 16 of FIG. 1) may supply control circuitry such as display driver integrated circuit 28 with information on images to be displayed on display 14.

To display the images on display pixels 22, display driver integrated circuit 28 may supply corresponding image data to data lines D while issuing clock signals and other control signals to supporting thin-film transistor display driver circuitry such as gate driver circuitry 18 and demultiplexing circuitry 20.

Gate driver circuitry 18 (sometimes referred to as scan line driver circuitry) may be formed on substrate 24 (e.g., on the left and right edges of display 14, on only a single edge of display 14, or elsewhere in display 14). Demultiplexer circuitry 20 may be used to demultiplex data signals from display driver integrated circuit 16 onto a plurality of corresponding data lines D. With this illustrative arrangement of FIG. 1, data lines D run vertically through display 14. Each data line D is associated with a respective column of display pixels 22. Gate lines G (sometimes referred to as scan lines) run horizontally through display 14. Each gate line G is associated with a respective row of display pixels 22. If desired, there may be multiple gate lines (scan lines) associated with each row of display pixels. Gate driver circuitry 18 may be located on the left side of display 14, on the right side of display 14, or on both the right and left sides of display 14, as shown in FIG. 1.

Gate driver circuitry 18 may assert gate signals (sometimes referred to as scan signals) on the gate lines G in display 14. For example, gate driver circuitry 18 may receive clock signals and other control signals from display driver integrated circuit 16 and may, in response to the received signals, assert a gate signal on gate lines G in sequence, starting with the gate line signal G in the first row of display pixels 22. As each gate line is asserted, data from data lines D is located into the corresponding row of display pixels. In this way, circuitry 28, 20, and 18 may provide display pixels 22 with signals that direct display pixels 22 to generate light for displaying a desired image on display 14.

Display driver circuitry such as demultiplexer circuitry 20 and gate line driver circuitry 18 may be formed from thin-film transistors on substrate 24. Thin-film transistors may also be used in forming circuitry in display pixels 22. The thin-film transistors in display 14 may, in general, be formed using any suitable type of thin-film transistor technology (e.g., silicon-based, semiconducting-oxide-based, etc.).

Figure 3:
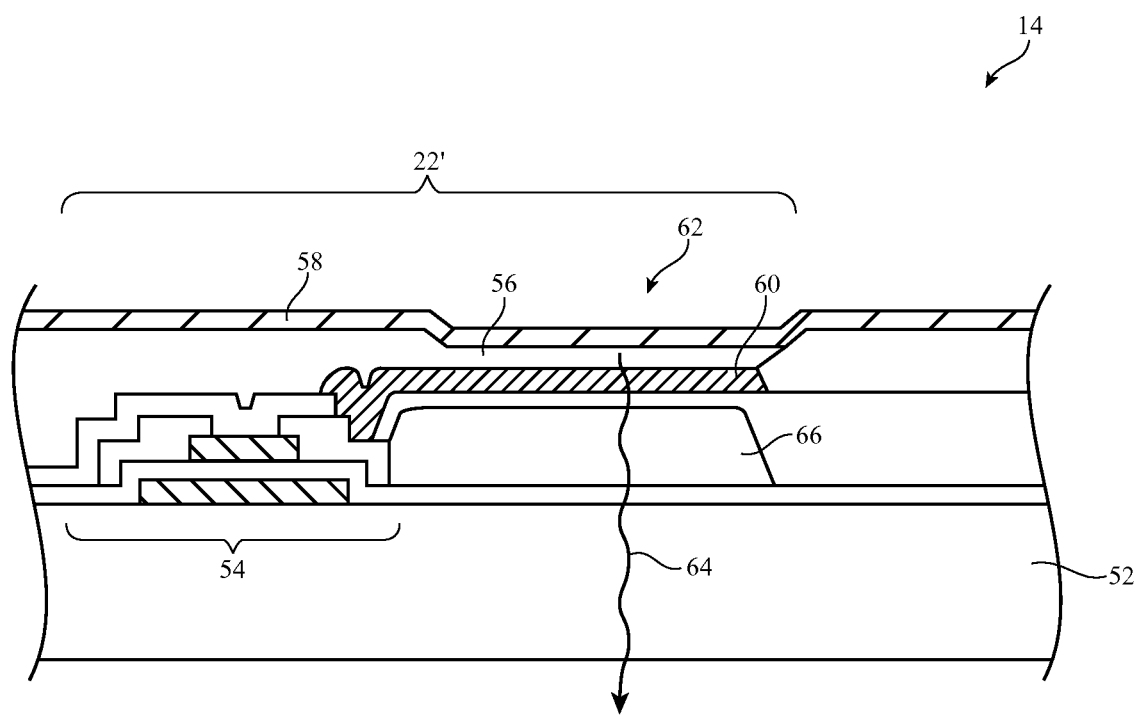
FIG. 3 is a cross-sectional side view of an illustrative organic light-emitting diode display in a bottom emission configuration in accordance with an embodiment.
Figure 4:
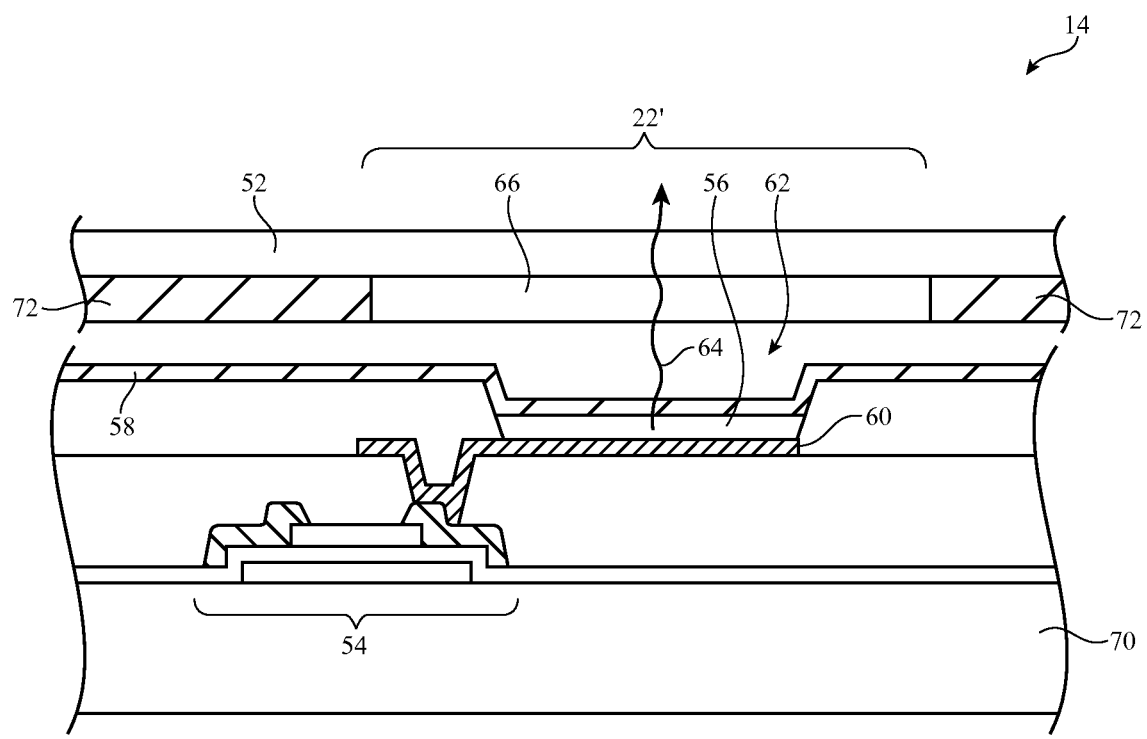
FIG. 4 is a cross-sectional side view of an illustrative organic light-emitting diode display in a top emission configuration in accordance with an embodiment.

Cross-sectional side views of configurations that may be used for display 14 of device 10 are shown in FIGS. 3 and 4. FIG. 3 is a cross-sectional side view of an illustrative bottom emission organic light-emitting diode display. FIG. 4 is a cross-sectional side view of an illustrative top emission organic light-emitting diode display.

In a bottom-emission display configuration of the type shown in FIG. 3, display 14 has a transparent substrate layer such as glass layer 52. Thin-film transistor circuitry such as thin-film transistor 54 may pass current between cathode 58 and anode 60 of light-emitting diode 62. As this current passes through organic light-emitting diode emissive electroluminescent layer 56, white light 64 is generated. The amount of current that is applied to electroluminescent material 56 controls the intensity of the resulting light 64 that is produced.

Light 64 passes through color filter element 66, which imparts a desired color to light 64. The resulting colored version of light 64 passes through clear substrate 52. The structures of FIG. 3 form a single subpixel 22' of a particular color (e.g., red in situations in which color filter element 66 is red, blue in situations in which color filter element 66 is blue, green in situations in which color filter element 66 is green, and white in situations in which color filter element 66 is clear or is absent). There may be four subpixels 22' per display pixel 22 in display 14 (e.g., a first subpixel 22' that is red, a second subpixel 22' that is blue, a third subpixel 22' that is green, and a fourth subpixel 22' that is white).

In a top-emission display configuration of the type shown in FIG. 4, display 14 has a substrate layer such as substrate 70. Thin-film transistor structures such as thin-film transistor 54 may pass current between cathode 58 and anode 60 of light-emitting diode 62. As this current passes through organic light-emitting diode emissive electroluminescent layer 56, white light 64 is generated. Light 64 passes through color filter element 66, which imparts a desired color to light 64, and passes through a transparent layer such as glass layer 52. Black matrix 72 may prevent stray light from exiting display 14. Color filter elements 66 are formed on the underside of glass layer 52 within openings in black matrix 72.

The structures of FIG. 4 form a single subpixel 22' of a particular color (e.g., red in situations in which color filter element 66 is red, blue in situations in which color filter element 66 is blue, green in situations in which color filter element 66 is green, and white in situations in which color filter element 66 is clear or is absent). As with bottom-emission displays, there may be four subpixels 22' per display pixel 22 in display 14 (e.g., a first subpixel 22' that is red, a second subpixel 22' that is blue, a third subpixel 22' that is green, and a fourth subpixel 22' that is white).

Figure 5:
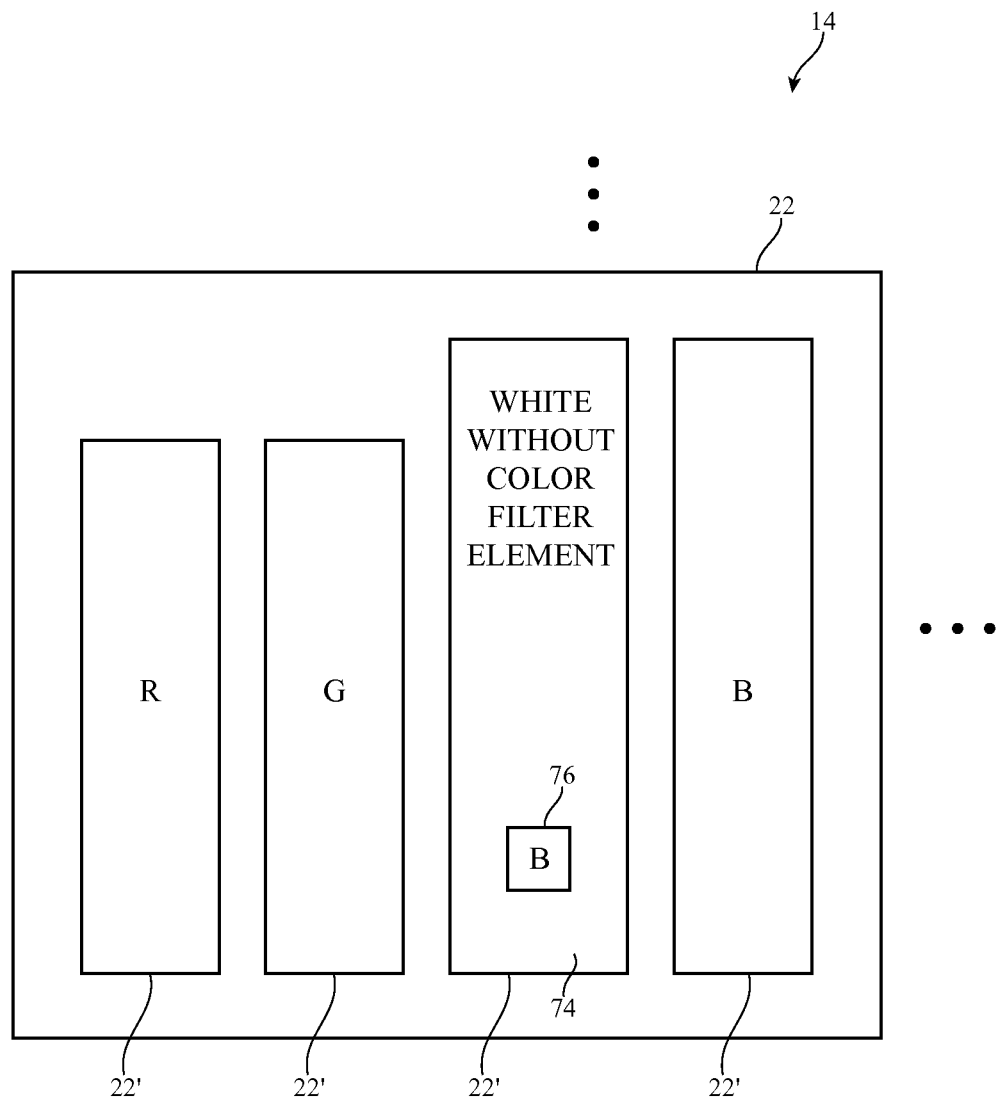
FIG. 5 is a top view of an illustrative organic light-emitting diode display pixel showing illustrative subpixels that may be included in the display pixel in accordance with an embodiment.

A top view of an illustrative display pixel 22 showing how display pixels 22 in display 14 may each contain four subpixels 22' is shown in FIG. 5. Each subpixel 22 has a respective color filter (e.g., one of color filter elements 66 of FIGS. 3 and 4). Organic light emissive layer 56 is preferably configured to emit white light. Color filters 66 in subpixels 22' impart colors to light 64. By controlling the amount of light 64 that is emitted from each of the subpixels 22' in a given display pixel 22, the display driver circuitry of display 14 can control the color of light that is emitted from that display pixel 22.

The presence of a clear color filter element (i.e., a missing color filter layer 66' or a clear layer of material) over white subpixel 22' allows light to be efficiently emitted from that subpixel. During operation, data that is encoded using red-green-blue color coordinates (RGB data) can be transformed (by control circuitry 16) into data that is encoded using red-green-blue-white color coordinates (RGBW data). This transformation can be used to turn on the white subpixel in display pixel 22 as often as possible to help reduce drive currents for the display pixels and thereby conserve power.

The color coordinates of a purely white subpixel generally will not match the color coordinates for the desired white point for display 14. A bluish white point for the white subpixels may be desirable for appealing images. Although the blue subpixel 22' could be turned on to contribute a blue component to the white emitted from the white subpixel, doing so excessively can degrade the lifetime of the blue sub-pixel and can consume more power than desired.

As shown in FIG. 5, white (clear) color filter element region 74 in white subpixel 22' is therefore preferably provided with a colored color filter structure such as blue color filter region 76. White (clear) region 74 may, for example, have a rectangular outline (i.e., white light may be emitted from within the rectangular outline of region 76 of FIG. 5). Blue color filter region 76 may, for example, contain a square patch of blue color filter material or one or more blue color filter element structures of other shapes within a rectangular area 74 for white subpixel 22'. The area of blue patch 76 may be relatively small compared to white area 74. For example, blue area 76 may be one fifth or less of area 74, blue area 76 may be one tenth or less of area 74, etc. Blue area 76 may be formed using one or more rectangular areas or areas of other shapes that overlap the light-emitting region for the white subpixel 22' (area 74). Area 74 emits white light, because that portion of display 14 is devoid of colored (red, blue, and green) color filter element material. Because a relatively small part of white subpixel 22' is overlapped by blue color filter structure 74 and a relatively large part of white subpixel 22' is not overlapped by any blue color filter material, white light emission efficiency is not significantly degraded.

Color filter elements 66 may be formed from transparent polymer containing dyes (e.g., red-dyed photoimageable polyimide, blue-dyed photoimageable, polyimide, and green-dyed photoimageable polyimide). Clear (white) areas may be formed using clear polyimide or other clear polymers or by forming an opening (e.g., a rectangular opening) overlapping the white subpixel light emitting area. If desired, blue color filter structure 76 and the blue color filter structure for blue subpixel 22' may be formed from the same patterned layer of blue-dyed polyimide (i.e., a common blue photoimageable polymer layer), thereby minimizing the number of photomasks used in forming display 14.

The size of blue color filter area 76 in white subpixel area 74 can be adjusted to adjust the white point for white subpixel 22'. If, for example, it is desired for the white subpixels 22' in display 14 to emit light that is more bluish, the size of blue color filter area 76 can be increased relative to the color-filter-element-free region 74 that overlaps the white display pixel. If it is desired to emit white light in the white display subpixels 22' that is less bluish, the ratio of the size of blue color filter 76 to the size of white subpixel 22' can be reduced.

During operation of a display that includes a blue color filter structure such as the blue color filter structure in blue color filter area 76 that lies within white subpixel region 74 of white subpixel 22', the presence of blue color filter 76 helps adjust the white point of the white light produced by the white subpixels to a desired set of color coordinates. When blue filter 76 is incorporated into white subpixel 22' in this way, power that might otherwise be expended in operating blue subpixel 22' to make the white light from white subpixel 22' more bluish can instead by entirely directed towards operating the white subpixel 22'. It is therefore not necessary to operate the blue subpixel whenever the white subpixel is used, thereby conserving power.

The foregoing is merely illustrative and various modifications can be made by those skilled in the art without departing from the scope and spirit of the described embodiments. The foregoing embodiments may be implemented individually or in any combination.

What is claimed is:

1. A display pixel in an organic light-emitting diode display, comprising:
   a red subpixel;
   a green subpixel;
   a blue subpixel that comprises a first blue color filter; and
   a white subpixel, wherein the white subpixel has an area that emits light and has a second blue color filter that overlaps part of the area, wherein the first and second blue color filters are separated by portions of the white subpixel, and wherein the second blue color filter is only adjacent to portions of the white subpixel.

2. The display pixel defined in claim 1 wherein the area that emits light has a rectangular outline and wherein the second blue color filter comprises a patch of blue color filter material within the rectangular outline.

3. The display pixel defined in claim 1 wherein the area that emits light has a first area and wherein the second blue color filter comprises blue polymer having a second area that is smaller than the first area and that overlaps the first area.

4. The display pixel defined in claim 1 wherein the red subpixel, the green subpixel, the blue subpixel, and the white subpixel each include organic electroluminescent material and thin-film transistor circuitry that applies current to the organic electroluminescent material.

5. An organic light-emitting diode display, comprising:
   an array of display pixels each of which has a white subpixel, wherein each white subpixel has a part that is overlapped by a colored color filter structure and a part that is not overlapped by colored color filter material, and wherein the part that is overlapped by the colored color filter structure is completely surrounded by the part that is not overlapped by colored color filter material.

6. The organic light-emitting diode display defined in claim 5 further comprising:
   control circuitry that directs the display pixels to generate light.

7. The organic light-emitting diode display defined in claim 6 wherein each display pixel includes a red subpixel, a blue subpixel, and a green subpixel that produce the light.

8. The organic light-emitting diode display defined in claim 7 wherein the colored color filter structure comprises blue material.

9. The organic light-emitting diode display defined in claim 8 wherein the blue material comprises a patch of blue polymer that overlaps the white subpixel.

10. The organic light-emitting diode display defined in claim 9 wherein the patch of blue polymer and the blue subpixel are formed from different areas of a common blue polymer layer.

11. The organic light-emitting diode display defined in claim 9 further comprising:
   organic electroluminescent material; and
   thin-film transistor circuitry that supplies signals to the organic electroluminescent material.

12. The organic light-emitting diode display defined in claim 11 wherein the display is a bottom-emission display comprising a transparent substrate through which the light passes from the red subpixel, the green subpixel, the blue subpixel, and the white subpixel of each display pixel.

13. The organic light-emitting diode display defined in claim 11 wherein the display is a top-emission display comprising a first layer on which the thin-film transistor circuitry is formed and a second layer through which the light from the red subpixel, the green subpixel, the blue subpixel, and the white subpixel of each display pixel passes.

14. The organic light-emitting diode display defined in claim 5 wherein the display is a bottom-emission display comprising a transparent substrate through which light passes from a red subpixel in each display pixel, a green subpixel in each display pixel, a blue subpixel in each display pixel, and the white subpixel of each display pixel.

15. The organic light-emitting diode display defined in claim 5 wherein the display is a top-emission display comprising a first layer on which the thin-film transistor circuitry is formed and a second layer through which light passes from a red subpixel in each display pixel, a green subpixel in each display pixel, a blue subpixel in each display pixel, and the white subpixel of each display pixel.

16. The organic light-emitting diode display defined in claim 15 wherein the red subpixel comprises a red color filter, wherein the blue subpixel comprises a blue color filter, wherein the green subpixel comprises a green color filter, and wherein the red color filter, the blue color filter, the green color filter, and the colored color filter material are formed on the second layer.

17. An organic light-emitting diode display, comprising:
   an array of display pixels; and
   control circuitry that directs the array of display pixels to generate light, wherein each display pixel includes red, blue, and green subpixels, wherein each display pixel comprises a white display pixel, and wherein each white subpixel comprises an area of color filter material that adjusts a white point associated with the white subpixel, wherein each white subpixel has a total surface area, wherein each area of color filter material has a surface area, and wherein the surface area of each area of color filter material is less than one tenth of the total surface area of each white subpixel.

18. The organic light-emitting diode display defined in claim 17 wherein the area of color filter material in each white subpixel comprises a patch of blue color filter material.

19. The organic light-emitting diode display defined in claim 18 wherein each white subpixel has a rectangular white subpixel area and wherein the patch of blue color filter material comprises a rectangle of blue color filter material formed in part of the rectangular white subpixel area.

20. The organic light-emitting diode display defined in claim 19 wherein the red subpixel comprises red color filter material, wherein the blue subpixel comprises blue color filter material, and wherein the green subpixel comprises green color filter material.

* * * * *